United States Patent
Sakurai

(10) Patent No.: US 8,539,170 B2
(45) Date of Patent: Sep. 17, 2013

(54) DECODING CIRCUIT

(75) Inventor: Toshio Sakurai, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 1220 days.

(21) Appl. No.: 12/021,720

(22) Filed: Jan. 29, 2008

(65) Prior Publication Data

US 2008/0183983 A1 Jul. 31, 2008

(30) Foreign Application Priority Data

Jan. 31, 2007 (JP) .................................. 2007-022234

(51) Int. Cl.
*G06F 12/00* (2006.01)
(52) U.S. Cl.
USPC .................................. 711/154; 711/E12.001
(58) Field of Classification Search
USPC .......................................... 711/154, E12.001
See application file for complete search history.

(56) References Cited

U.S. PATENT DOCUMENTS

| | | | | |
|---|---|---|---|---|
| 4,835,686 A | * | 5/1989 | Furuya et al. | 711/136 |
| 6,503,004 B2 | | 1/2003 | Togami | 400/63 |
| 2004/0003164 A1 | * | 1/2004 | Boily | 710/306 |
| 2005/0226513 A1 | * | 10/2005 | Wallace et al. | 382/232 |

FOREIGN PATENT DOCUMENTS

| | | |
|---|---|---|
| JP | 8-227376 | 9/1996 |
| JP | 2000-103113 A | 4/2000 |
| JP | 2001-147854 A | 5/2001 |
| JP | 2001-274989 | 10/2001 |

\* cited by examiner

*Primary Examiner* — Larry Mackall
(74) *Attorney, Agent, or Firm* — Fitzpatrick, Cella, Harper & Scinto

(57) ABSTRACT

This invention makes it possible to use an inexpensive memory as the line memory of a decoding circuit. To do this, a command comparator separates compressed data into a first command that requires memory access and a second command requires no memory access. A decoder requests memory read of decompressed data necessary for decompression of the first command, decodes the first command based on the decompressed data, and requests memory write of decompressed data obtained by decoding. A RAM access controller controls read and write of a RAM cache and a line memory and executes memory read and memory write corresponding to a request from the decoder.

4 Claims, 4 Drawing Sheets

DECODING CIRCUIT

BACKGROUND OF THE INVENTION

1. Field of the Invention

The present invention relates to a decoding circuit which decompresses lossless-encoded compressed data.

2. Description of the Related Art

In decompressing lossless-encoded data, a decoding circuit decomposes the compressed data into commands and then performs a decoding operation by referring to data (decompressed data) stored in a line memory.

FIG. 1 is a block diagram showing an example of a decoding circuit.

An input buffer 201 temporarily stores compressed data input from the outside of the decoding circuit. The input buffer 201 has a memory size larger than the maximum code length defined for the compressed data so as to smoothly execute the process of the succeeding stage of the decoding circuit.

A command comparator 202 connected to the input buffer 201 has a command table 203. The command table 203 is formed from, e.g., a read-only memory (ROM) to record information (to be referred to as a command pattern hereinafter) necessary for decompressing compressed data, such as the type, attribute, and length of each command.

The command comparator 202 reads out a command pattern from the command table 203 and compares it with the compressed data received from the input buffer 201. The command comparator 202 notifies the input buffer 201 of the command length as the length of actually decoded data and transmits the command type and attribute of the comparison result to a decoder 204.

The input buffer 201 destructs data corresponding to the data length received from the command comparator 202 as decoded data and requests new external data as needed.

The decoder 204 has a line memory 205. The line memory 205 is formed from a random access memory (RAM) and serves as a temporary storage circuit for which data write or read is executed in decompressing compressed data. The decoder 204 is connected to an output buffer 206 which temporarily stores the decompressed data.

The decoder 204 determines based on the command type and attribute whether the decoding is that of raw data or a command that requires read access to the line memory 205. In decoding raw data, the decoder 204 transmits a raw component separated from the command to the output buffer 206. At this time, the raw component is written in the line memory 205 as a decoding result.

In decoding a command (decompressing compressed data) which requires read access to the line memory 205, the decoder 204 reads out data necessary for decompression of the compressed data from the line memory 205, executes a predetermined process, and transmits the decompressed data to the output buffer 206. At this time, the decompressed data is written in the line memory 205, as in decoding of raw data.

In decoding a command (decompressing compressed data) which requires read access to the line memory 205, access to the line memory 205 occurs after the command is passed through the command comparator 202 and input to the decoder 204. At this time, access to the line memory 205 is executed not continuously but discretely. A static RAM (SRAM) can cope with such access, and the line memory 205 normally uses an SRAM. However, the SRAM is more expensive than a RAM of another scheme such as a synchronous dynamic RAM (SDRAM).

SUMMARY OF THE INVENTION

In one aspect, a decoding circuit for decompressing lossless-encoded compressed data, comprises: a separator, arranged to separate the compressed data into a first command that requires memory access and a second command that requires no memory access, by referring to a command table; a decoder, arranged to request memory read of decompressed data necessary for decompression of the first command, decode the first command based on the decompressed data, and request memory write of decompressed data obtained by decoding; and a memory controller, arranged to control read and write of a cache memory and a line memory and execute memory read and memory write corresponding to a request from the decoder.

According to the aspect, an inexpensive memory can be used as the line memory of a decoding circuit.

Further features of the present invention will become apparent from the following description of exemplary embodiments with reference to the attached drawings.

DESCRIPTION OF THE EMBODIMENTS

A decoding circuit according to an embodiment of the present invention will be described below in detail with reference to the accompanying drawings.

First Embodiment

Figure 1:
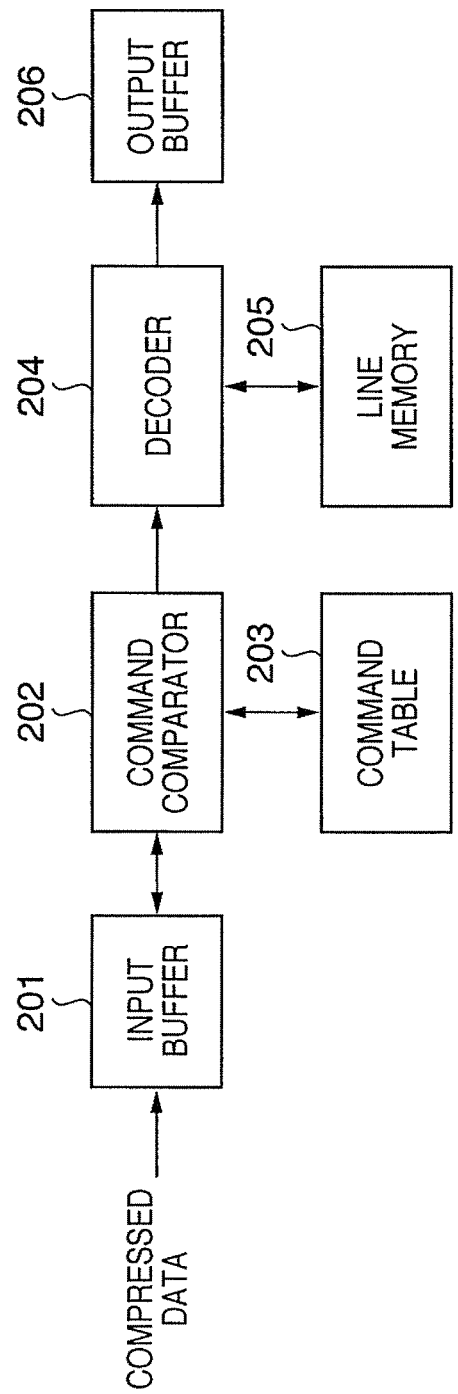
FIG. 1 is a block diagram showing an example of a decoding circuit.
Figure 2:
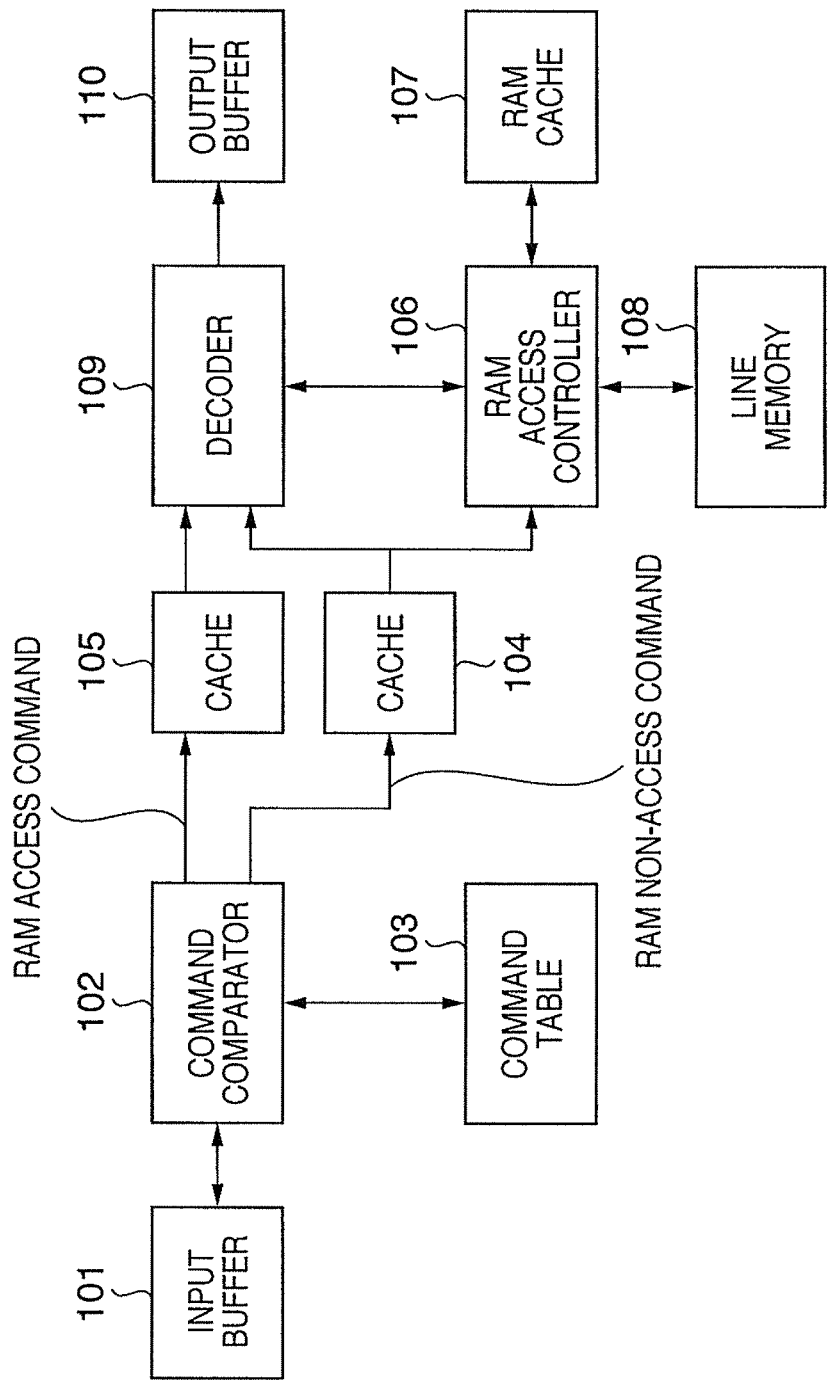
FIG. 2 is a block diagram showing the arrangement of a decoding circuit according to the first embodiment.

FIG. 2 is a block diagram showing the arrangement of a decoding circuit according to the first embodiment.

An input buffer 101 temporarily stores compressed data, i.e., lossless-encoded data input from the outside of the decoding circuit. The input buffer 101 has a memory size larger than the maximum code length defined for the compressed data so as to smoothly execute the process of the succeeding stage of the decoding circuit.

A command comparator 102 connected to the input buffer 101 has a command table 103. The command table 103 is formed from, e.g., a ROM to record information necessary for decompressing compressed data, such as the type, attribute, and length of each command. The command comparator 102 also has a cache 104 for a command that requires RAM access (to be referred to as a RAM access command hereinafter) and a cache 105 for a command that does not require RAM access (to be referred to as a RAM non-access command hereinafter).

The command comparator 102 reads out a command pattern from the command table 103 and compares it with the compressed data received from the input buffer 101. The command comparator 102 notifies the input buffer 101 of the command length as the length of actually decoded data. The command comparator 102 also separates the commands into RAM access commands and RAM non-access commands based on the comparison result and sends them to the caches 104 and 105.

The input buffer 101 destructs data corresponding to the data length received from the command comparator 102 as decoded data and requests new external data as needed.

The cache 104 stores a predetermined number of commands that require access to a line memory 108. The cache 104 is connected to a RAM access controller 106. The RAM access controller 106 includes a RAM cache 107 and the line memory 108.

The RAM access controller 106 reads out a RAM access command stored in the cache 104 and extracts continuous access associated with actual addresses of the line memory 108. To read out data from the line memory 108, the read operation to continuous addresses is executed using a burst cycle (burst read), thereby reading out data from the line memory 108. The readout data is stored in the RAM cache 107. To write data in the line memory 108, the process waits until the size of data stored in the RAM cache 107 reaches a size that enables write (burst write) using a burst cycle. When data with a size capable of burst write are stored in the RAM cache 107, the data of continuous addresses are read out from the RAM cache 107, and a write operation (burst write) is executed in continuous addresses, thereby writing data in the line memory 108.

A decoder 109 is connected to the caches 104 and 105 and the RAM access controller 106. To decode a RAM access command, the decoder 109 decompresses compressed data by accessing the RAM access controller 106.

When a data read request from the decoder 109 is received, and corresponding data exists in the RAM cache 107, the RAM access controller 106 accesses the RAM cache 107. If no corresponding data exists in the RAM cache 107, the RAM access controller 106 accesses the line memory 108. The RAM access controller 106 reads out the corresponding data from the RAM cache 107 or line memory 108 and supplies it to the decoder 109. Upon receiving a decompressed data write request from the decoder 109, the RAM access controller 106 writes decompressed data in the RAM cache 107.

To decode a RAM non-access command, the decoder 109 separates a raw component from a command read out from the cache 105. At this time, the decoder 109 requests the RAM access controller 106 to write the separated raw component as a decoding result. Upon receiving the write request, the RAM access controller 106 executes the same operation as in decoding a RAM access command.

The decoder 109 writes decompressed data or separated raw component in an output buffer 110. The decoded data is output from the decoding circuit via the output buffer 110.

Figure 4:
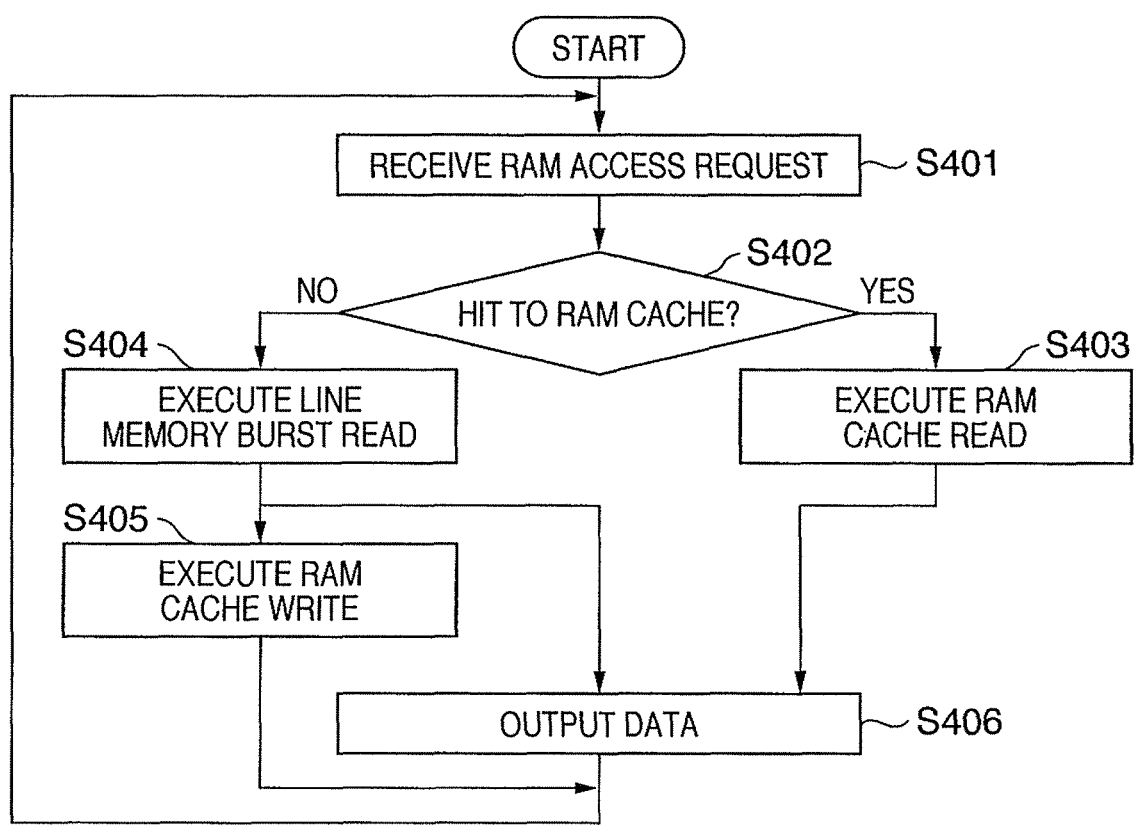
FIG. 4 is a flowchart illustrating the memory access operation of a RAM access controller.

FIG. 4 is a flowchart illustrating the memory access operation of the RAM access controller 106.

The RAM access controller 106 receives a RAM access request from the decoder 109 (S401) and determines whether a hit to the contents of the line memory 108 currently held in the RAM cache 107 occurs (S402). In case of a hit, corresponding data is read out from the RAM cache 107 (S403). In case of a miss, the RAM access controller 106 burst-reads the line memory 108 (S404) and writes the burst-read data in the RAM cache 107 (S405).

Of the data read out in step S403 or S404, the RAM access controller 106 outputs data designated by the RAM access request to the decoder 109 (S406).

In this way, RAM access commands are accumulated in the cache. The read operation and write operation for continuous addresses of the line memory are done using the burst cycle via the RAM cache. This makes it possible to use not an expensive SRAM but an inexpensive burst-accessible SDRAM as the line memory to be used for decompression of compressed data and to reduce the cost of the decoding circuit.

Second Embodiment

A decoding circuit according to the second embodiment of the present invention will be described below. The same reference numerals as in the first embodiment denote the same components in the second embodiment, and a detailed description thereof will be omitted.

Figure 3:
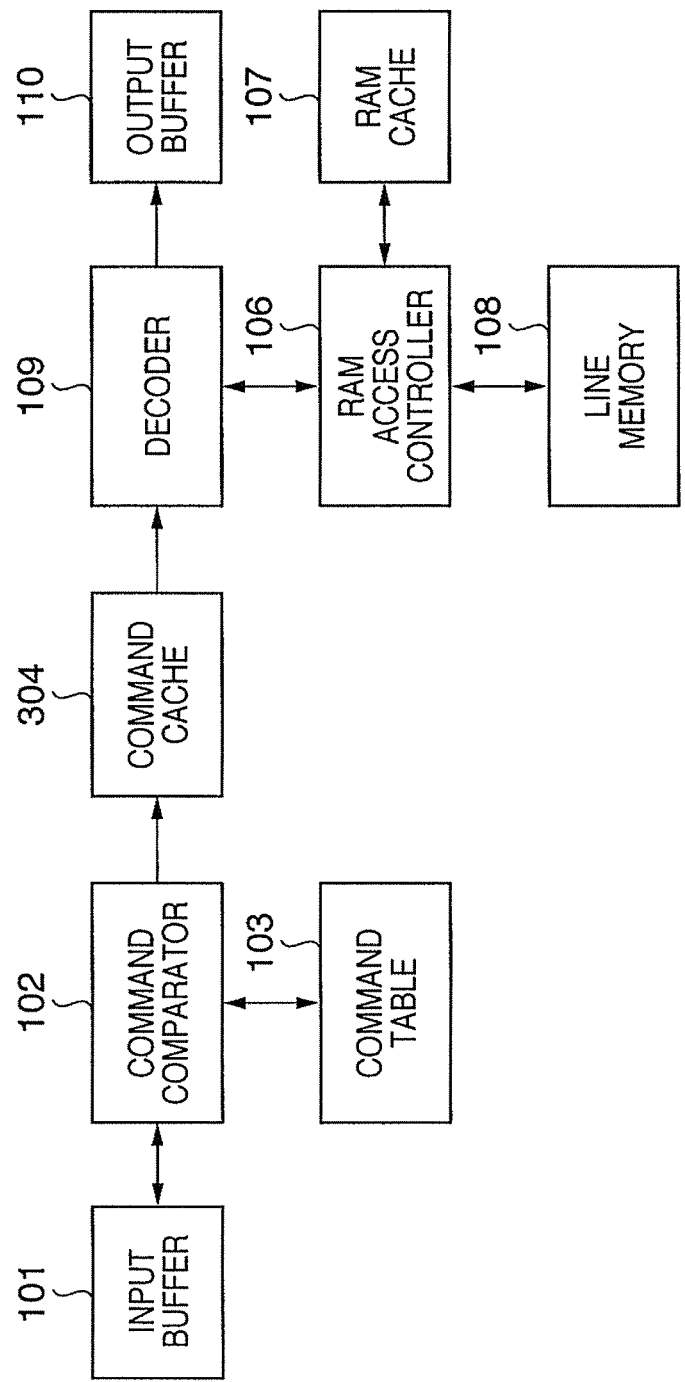
FIG. 3 is a block diagram showing the arrangement of a decoding circuit according to the second embodiment.

FIG. 3 is a block diagram showing the arrangement of the decoding circuit according to the second embodiment.

A command cache 304 temporarily time-serially stores information necessary for decompression such as the type, attribute, and length of each command output from a command comparator 102.

A decoder 109 reads out a command sequence accumulated in the command cache 304 and, for a RAM access command, requests a RAM access controller 106 to access a memory.

When a data read request from the decoder 109 is received, and corresponding data exists in a RAM cache 107, the RAM access controller 106 accesses the RAM cache 107. If no corresponding data exists in the RAM cache 107, the RAM access controller 106 accesses a line memory 108. The RAM access controller 106 reads out the corresponding data from the RAM cache 107 or line memory 108 and supplies it to the decoder 109. Upon receiving a decompressed data write request from the decoder 109, the RAM access controller 106 writes decompressed data in the RAM cache 107.

To decode a RAM non-access command, the decoder 109 separates a raw component from a command read out from the command cache 304. At this time, the decoder 109 requests the RAM access controller 106 to write the separated raw component as a decoding result. Upon receiving the write request, the RAM access controller 106 executes the same operation as in decoding a RAM access command.

As in the first embodiment, the RAM access controller 106 executes data read and write between the RAM cache 107 and the line memory 108 by using a burst cycle.

In this way, the read operation and write operation for continuous addresses of the line memory are done by using the burst cycle via the RAM cache. This makes it possible to use not an expensive SRAM but an inexpensive burst-accessible SDRAM as the line memory to be used for decompression of compressed data and to reduce the cost of the decoding circuit.

Exemplary Embodiments

The present invention can be applied to a system constituted by a plurality of devices (e.g., host computer, interface, reader, printer) or to an apparatus comprising a single device (e.g., copying machine, facsimile machine).

Further, the present invention can provide a storage medium storing program code for performing the above-described processes to a computer system or apparatus (e.g., a personal computer), reading the program code, by a CPU or MPU of the computer system or apparatus, from the storage medium, then executing the program.

In this case, the program code read from the storage medium realizes the functions according to the embodiments.

Further, the storage medium, such as a floppy disk, a hard disk, an optical disk, a magneto-optical disk, CD-ROM, CD-R, a magnetic tape, a non-volatile type memory card, and RON can be used for providing the program code.

Furthermore, besides above-described functions according to the above embodiments can be realized by executing the program code that is read by a computer, the present invention includes a case where an OS (operating system) or the like working on the computer performs a part or entire processes in accordance with designations of the program code and realizes functions according to the above embodiments.

Furthermore, the present invention also includes a case where, after the program code read from the storage medium is written in a function expansion card which is inserted into the computer or in a memory provided in a function expansion unit which is connected to the computer, CPU or the like contained in the function expansion card or unit performs a part or entire process in accordance with designations of the program code and realizes functions of the above embodiments.

In a case where the present invention is applied to the aforesaid storage medium, the storage medium stores program code corresponding to the flowcharts described in the embodiments.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-022234, filed Jan. 31, 2007, which is hereby incorporated by reference herein in its entirety.

What is claimed is:

1. A decoding circuit for decompressing lossless-encoded compressed data, comprising:
 a separator constructed to separate the lossless-encoded compressed data into a first command that requires memory access and a second command that requires no memory access, by referring to a command table;
 a first cache memory which stores a predetermined number of first commands separated by the separator;
 a second cache memory which stores a predetermined number of second commands separated by the separator;
 a decoder constructed to request memory reading of decompressed data necessary for decompression of the first command, to decode the first command based on the decompressed data, and to request memory writing of decompressed data obtained by decoding; and
 a memory controller constructed to control reading and writing of a third cache memory and a line memory, wherein the line memory is a semiconductor memory other than a static random access memory, and to execute memory reading and memory writing corresponding to a request from the decoder,
 wherein, in response to a memory read request from the decoder, when corresponding data exists in the third cache memory, the memory controller supplies, to the decoder, at least part of data read out from the third cache memory, and when no corresponding data exists in the third cache memory, the memory controller supplies, to the decoder, at least part of data burst-read from actual addresses of the line memory based on reading of the first command stored in the first cache memory.

2. The circuit according to claim 1, wherein the decoder decodes the second command and requests the memory controller to execute memory writing of decompressed data obtained by decoding.

3. The circuit according to claim 1, wherein in response to a memory write request from the decoder, the memory controller stores decompressed data received from the decoder in the third cache memory, and when data with a predetermined size is accumulated in the third cache memory, the memory controller writes the data with the predetermined size in continuous addresses of the line memory.

4. The circuit according to claim 1, wherein in response to a memory write request from the decoder, the memory controller stores decompressed data received from the decoder in the third cache memory, and when data with a size that enables burst writing is accumulated in the third cache memory, the memory controller burst-writes the data with the predetermined size in the line memory.

* * * * *